(12) United States Patent
Mulder

(10) Patent No.: US 7,208,980 B2
(45) Date of Patent: Apr. 24, 2007

(54) COMPARATOR WITH OFFSET COMPENSATION

(75) Inventor: Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 35 days.

(21) Appl. No.: 11/038,386

(22) Filed: Jan. 21, 2005

(65) Prior Publication Data

US 2006/0164125 A1    Jul. 27, 2006

(51) Int. Cl.
*G01R 19/00* (2006.01)

(52) U.S. Cl. .......................................... 327/52; 327/63

(58) Field of Classification Search ................ 327/52, 327/55, 57, 63, 65
See application file for complete search history.

(56) References Cited

U.S. PATENT DOCUMENTS

| | | | | |
|---|---|---|---|---|
| 6,215,331 B1 * | 4/2001 | Setty et al. | .................... | 327/51 |
| 6,847,569 B2 * | 1/2005 | Sinha et al. | ................. | 365/207 |
| 7,023,243 B2 * | 4/2006 | Wijetunga et al. | ............ | 327/57 |

OTHER PUBLICATIONS

Al-Rawi, G.A., "A New Offset Measurement And Cancellation Technique For Dynamic Latches," *Proceedings of the 2002 IEEE International Symposium on Circuits and Systems*, vol. V of V, pp. 149-152 (May 26-29, 2002).
Bracey, M. et al., "A Full Nyquist 15 MS/s 8-b Differential Switched-Current A/D Converter," *IEEE Journal of Solid-State Circuits*, vol. 31, No. 7, pp. 945-951 (Jul. 1996).
Shima, T. and Miyoshi, K., "Simple And Accurate Comparator Circuit," *Conference Proceedings of the 2002 45th Midwest Symposium on Circuits and Systems*, vol. I of III, pp. 299-302 (Aug. 4-7, 2002).
Trynza, M. et al., "An 8-Bit 3MS/S CMOS Two-Step Flash Converter For Low Voltage Mixed Signal CMOS Integration," *2nd International Conference on Advanced A-D and D-A Conversion Techniques and Their Applications*, Conference Publication No. 383, IEE, p. 71-75 (Jul. 6-8, 1994).
Worapishet, A. et al., "An Improved CMOS Offset-Compensated Current Comparator For High Speed Applications," *Proceedings of the 1998 IEEE International Symposium on Circuits and Systems*, vol. 1 of 6, pp. 535-538 (May 31-Jun. 3, 1998).

* cited by examiner

*Primary Examiner*—Quan Tra
*Assistant Examiner*—Ryan C. Jager
(74) *Attorney, Agent, or Firm*—Sterne, Kessler, Goldstein & Fox P.L.L.C.

(57) ABSTRACT

A differential comparator with reduced offset. The differential comparator includes a first transistor coupled to a first input current and a second transistor coupled to a second input current. The first and second transistors are biased as diodes during a reset phase to store an offset voltage on parasitic capacitances of the first and second transistors. The first and second transistors are connected together as a latch to provide an output during a latch phase. Drain currents of the first and the second transistors substantially equal the first and the second input currents, respectively, during the reset phase and at the beginning of the latch phase. During the latch phase, currents approximately twice as large as differential-mode signal currents provided by the first and the second input currents are provided to the first and the second transistors, respectively.

17 Claims, 8 Drawing Sheets

COMPARATOR WITH OFFSET COMPENSATION

BACKGROUND OF THE INVENTION

1. Field of the Invention

The present invention generally relates to comparators. More specifically, the present invention is directed to reducing an offset of a comparator using an auto-zeroing technique.

2. Related Art

A comparator is designed to compare an input signal to a known reference level. The input signal can be an input voltage or an input current. Correspondingly, the known reference level can be a voltage reference level or a current reference level. The ideal reference level of the comparator is exactly zero. Typically, the comparator is designed to output a logic "1" at the end of a clock cycle, when an input signal exceeds the known reference level, and to output a logic "0" at the end of the clock cycle, when the input signal is below the known reference level.

Transistors arranged to provide positive feedback are typically used to implement the comparator. The reference level of the comparator is influenced by the threshold voltages of the transistors. Mismatches in the physical characteristics of the transistors used to implement the comparator cause the threshold voltages of the transistors to differ. Consequently, a difference between the threshold voltages of the transistors often causes the reference level of the comparator to deviate from the ideal level. The amount of deviation from the ideal reference level is represented as either a voltage offset or a current offset. This comparator offset can cause the comparator to provide an incorrect output value for a given input value, resulting in comparator inaccuracy. As the input signal becomes smaller, the comparator becomes increasingly prone to inaccuracies caused by the comparator offset.

Comparators are basic building blocks of an Analog-to-Digital Converter (ADC). Comparator offset is an important parameter of the ADC. A common technique used to minimize the effect of the comparator offset involves preamplifying the input signal of the comparator. In many ADC architectures, such as flash ADCs, folding ADCs or two-step flash ADCs, the amount of comparator offset determines how much preamplification is needed on the front-end of a comparator array.

An alternative to preamplification of the input signal is offset compensation. In ADCs where many comparators operate in parallel, improving the offset performance of the comparators can lead to substantial area and power savings in the ADC design. That is, comparators that have lower offset resulting from offset compensation require less preamplification, and therefore fewer stages of preamplifiers, in their front-ends.

Auto-zeroing techniques are often used to reduce the offset of the comparator. During a reset phase of the comparator, the offset of the comparator is stored on capacitors. During the succeeding latch phase, the comparator produces a comparator output after transitioning from a meta-stable state to a stable state. The offset stored during the reset phase of the comparator is used to compensate for the offset of the comparator during the latch phase. This compensation technique helps minimize the effect of the comparator offset during the latch phase.

Many auto-zeroing techniques have been developed. However, these techniques typically require a significant amount of additional circuit components. The use of additional circuit elements increases the area, and often the power consumption, of the comparator. For example, several auto-zeroing techniques require a large number of extra capacitors to accomplish offset compensation. The introduction of a large number of capacitors, in turn, requires considerable chip area. Other auto-zeroing techniques require the addition of an amplifier to perform offset compensation, which increases power and space requirements. Lastly, techniques which use the source-gate capacitances of additional transistors increase the power consumption of the comparator due to the biasing requirements of the introduced transistors. Further, these techniques require the introduction of a large number of additional switches.

SUMMARY OF THE INVENTION

Accordingly, the present invention is related to a comparator with offset compensation that minimizes space requirements and reduces power consumption, thereby substantially obviating one or more of the disadvantages of the related art.

In one aspect, there is provided a differential comparator with reduced offset. The differential comparator includes a first transistor coupled to a first input current and a second transistor coupled to a second input current. The first and the second transistors are biased as diodes during a reset phase and are connected together as a latch to provide an output during a latch phase. A drain current of the first transistor is substantially equal to the first input current and a drain current of the second transistor is substantially equal to the second input current during the reset phase and at the beginning of the latch phase. An offset voltage of the differential comparator is stored on parasitic capacitances of the first and the second transistors during the reset phase. During the latch phase, currents approximately twice as large as differential-mode signal currents provided by the first and the second input currents are provided to the first and the second transistors, respectively.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
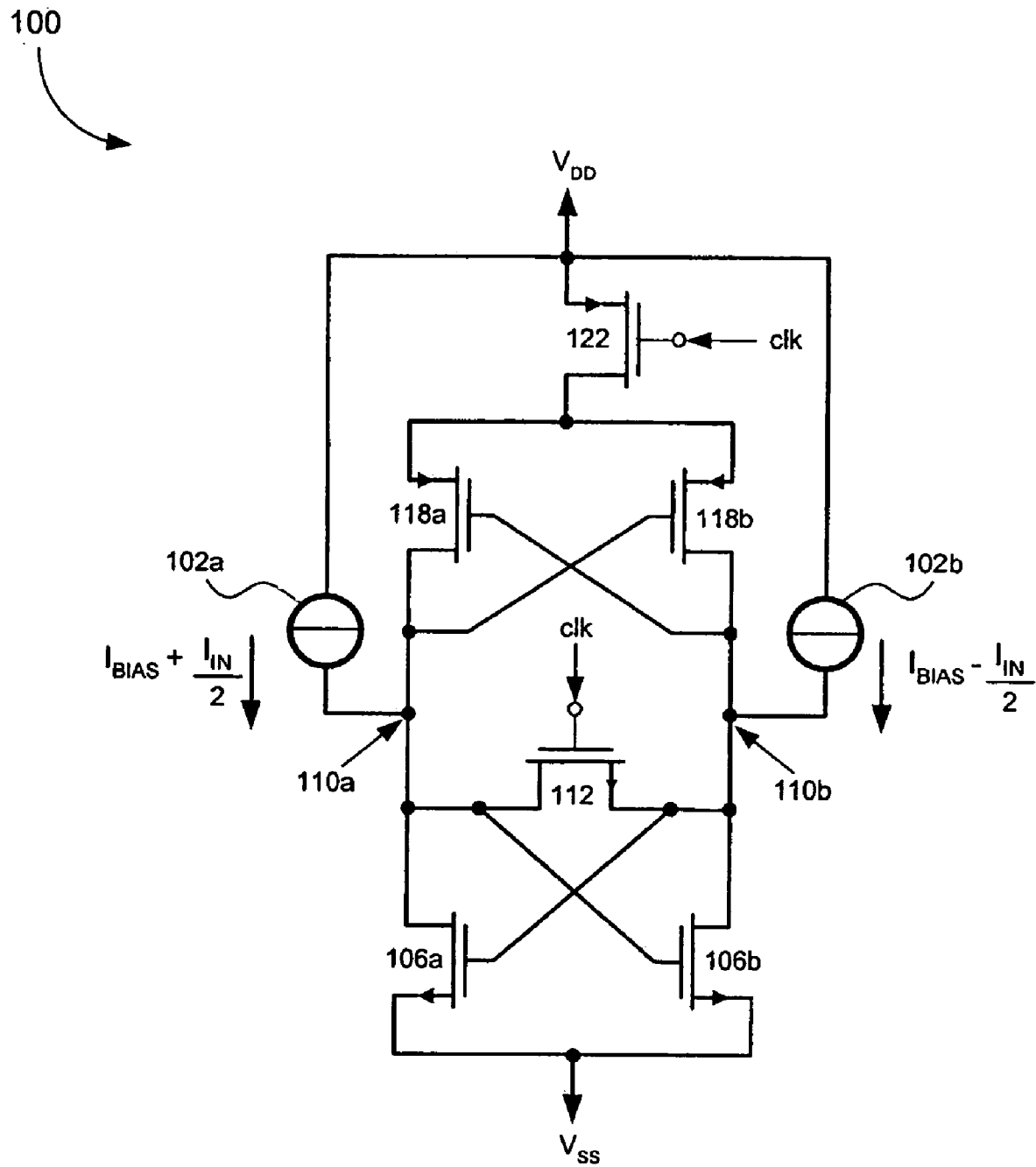
FIG. 1 illustrates an exemplary conventional differential comparator without offset compensation.

FIG. 1 illustrates an exemplary conventional differential comparator 100. The differential comparator 100 has an input including a differential-mode signal current $I_{IN}$ and a common-mode bias current $I_{BIAS}$. The input current can be, for example, the output of a preceding differential pair amplifier. A differential input current source 102a provides an input current equal to $I_{BIAS}+I_{IN}/2$. A differential input current source 102b provides a complementary input current equal to $I_{BIAS}-I_{IN}/2$. Together, nodes 110a and 110b provide an output of the differential comparator 100. Usually, the differential comparator 100 is followed by an SR-latch that can store the decision of the comparator for approximately one full clock cycle.

As further shown in FIG. 1, the differential comparator 100 includes an N-channel type metal oxide semiconductor field effect transistor (NMOSFET) 106a and an NMOSFET 106b. A source of the NMOSFET 106a and a source of the NMOSFET 106b are connected to a supply voltage $V_{SS}$. The supply voltage $V_{SS}$ is a relatively low supply voltage. For example, $V_{SS}$ could be a ground or a negative supply voltage. The supply voltage $V_{SS}$ often represents a logic "0." A gate of the NMOSFET 106a is connected to a drain of the NMOSFET 106b. Similarly, a gate of the NMOSFET 106b is connected to a drain of the NMOSFET 106a. This cross-attached configuration of NMOSFETs 106a and 106b provides positive feedback between the NMOSFETs 106a and 106b. The drain of the NMOSFET 106a is connected to a drain of an NMOSFET 112 at the node 110a. The drain of the NMOSFET 106b is connected to a source of the NMOSFET 112 at the node 110b. A gate of the NMOSFET 112 is configured to receive a clock signal (clk). The NMOSFET 112 operates as a switch responsive to the clock signal clk.

The differential comparator 100 further includes a P-channel type metal oxide semiconductor field effect transistor (PMOSFET) 118a and a PMOSFET 118b. A drain of the PMOSFET 118a is connected to a gate of the PMOSFET 118b. Similarly, a drain of the PMOSFET 118b is connected to a gate of the PMOSFET 118a. This cross-attached configuration of PMOSFETs 118a and 118b provides positive feedback between the PMOSFETs 118a and 118b. A source of the PMOSFET 118a and a source of the PMOSFET 118b are both connected to a drain of a PMOSFET 122. A source of the PMOSFET 122 is connected to a supply voltage $V_{DD}$, which is a relatively high supply voltage. However, in many applications, the voltage supply $V_{DD}$ may not exceed 1.2 volts and may be as low as 1 volt. The voltage supply $V_{DD}$ often represents a logic "1." A gate of the PMOSFET 122 is also configured to receive the clock signal clk. The PMOSFET 112 operates as a switch responsive to the clock signal clk.

Together, the NMOSFET 106a, the NMOSFET 106b and the NMOSFET 112 form an NMOS latch. Similarly, the PMOSFET 118a, the PMOSFET 118b and the PMOSFET 122 form a PMOS latch. The NMOS latch and the PMOS latch are arranged in a stacked configuration between the supply voltages $V_{SS}$ and $V_{DD}$. The gate of the PMOSFET 118b and the drain of the PMOSFET 118a are connected to the NMOS latch at the node 110a. The gate of the PMOSFET 118a and the drain of the PMOSFET 118b are connected to the NMOS latch at the node 110b. Effectively, the gates of the NMOSFET 106a and the NMOSFET 106b are cross-attached to the drains of the PMOSFET 118b and the PMOSFET 118a, respectively. Similarly, the gates of the PMOSFET 118a and the PMOSFET 118b are cross-attached to the drains of the NMOSFET 106b and the NMOSFET 106a, respectively.

Figure 2:
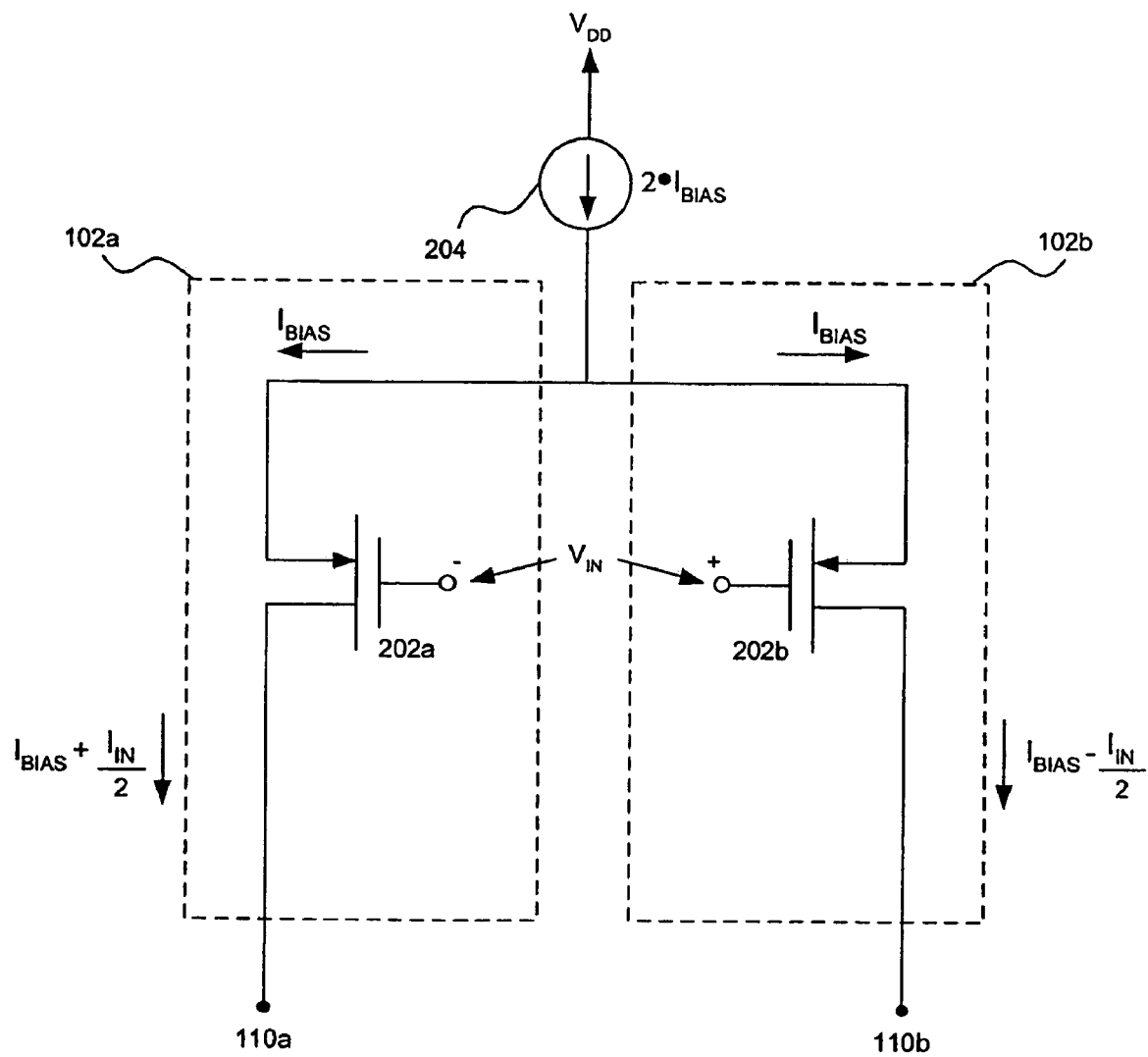
FIG. 2 illustrates a configuration of differential input current sources of the exemplary conventional differential comparator.

FIG. 2 illustrates a configuration of the differential input current sources 102a and 102b in more detail. The differential input current source 102a includes a PMOSFET 202a. The differential input current source 102b includes a PMOSFET 202b. A source of the PMOSFET 202a is connected to a source of the PMOSFET 202b. The sources of the PMOSFETs 202a and 202b are connected to a current source 204. The current source 204 supplies a bias current equal to $2 \cdot I_{BIAS}$. The current source 204 is connected to the voltage supply $V_{DD}$. The current source 204 supplies the bias current $I_{BIAS}$ to the sources of the PMOSFETs 202a and 202b. A drain of the PMOSFET 202a is connected to the node 110a. A drain of the PMOSFET 202b is connected to the node 110b.

A gate of the PMOSFET 202a and a gate of the PMOSFET 202b are connected to a differential-mode input voltage $V_{IN}$. The differential-mode input voltage $V_{IN}$ applied to the gate of the PMOSFET 202a and the gate of the PMOSFET 202b provides the differential-mode signal current $I_{IN}$ to the node 110a and the node 110b. Specifically, the differential-mode input voltage $V_{IN}$, in conjunction with the current source 204, provides the input current equal to $I_{BIAS}+I_{IN}/2$. Similarly, the differential-mode input voltage, in conjunction with the current source 204, provides the input current equal to $I_{BIAS}-I_{IN}/2$. The magnitude of the differential-mode signal current $I_{IN}$ is proportional to the magnitude of the differential-mode input voltage $V_{IN}$ applied to the gates of the PMOSFET 202a and the PMOSFET 202b.

The differential comparator 100 operates in two distinctive clock phases within one clock cycle. The first clock phase is a reset phase and the second clock phase is a latch phase. During the reset phase, the clock signal clk applied to the gate of the NMOSFET 112 and the PMOSFET 122 is relatively high. The NMOSFET 112 is turned on by the clock signal clk being relatively high. Turning on the NMOSFET 112 results in connecting the node 110a to the node 110b. In effect, the gate of the NMOSFET 106a and the gate of the NMOSFET 106b are connected together. A voltage at the node 110a is therefore equal to a voltage at the node 110b during the reset phase. This operation erases the output of the differential comparator 100 from the previous latch phase.

Also, during the reset phase, the PMOSFET 122 is turned off by the clock signal clk being relatively high. Turning the PMOSFET 112 off ensures that the PMOS latch is disconnected from the voltage supply $V_{DD}$ during the reset phase. Disconnecting the PMOS latch from the voltage supply $V_{DD}$ prevents excessive current flow from the voltage supply $V_{DD}$ to the voltage supply $V_{SS}$.

The latch phase of the differential comparator 100 begins when the NMOSFET 112 is turned off and the PMOSFET 122 is turned on. Specifically, the latch phase begins when the clock signal clk is relatively low. With the PMOSFET 122 turned on, the PMOS latch is connected to the voltage supply $V_{DD}$. With the NMOSFET 112 turned off, the gate of the NMOSFET 106a is no longer connected to the gate of the NMOSFET 106b.

At the beginning of the latch phase, the differential comparator 100 is in a meta-stable state. The differential comparator 100 uses the positive feedback configuration of the NMOS latch and the PMOS latch to transition into one of two possible stable states during the latch phase. The PMOSFETs 118a and 118b serve to increase the transition speed of the differential comparator 100. Which stable state the differential comparator 100 switches to is determined by the value of the differential-mode signal current $I_{IN}$ relative to a threshold level (i.e., the known reference level) of the differential comparator 100.

An ideal threshold level is $I_{IN}=0$. As a result of the positive feedback the NMOS latch and of the PMOS latch, when $I_{IN}>0$, the node 110a will "clip" to the supply voltage $V_{DD}$ and the node 110b will "clip" to the supply voltage $V_{SS}$. A logic "1" and a logic "0" are therefore output at the nodes 110a and 110b, respectively, at the end of the latch phase. This output state is one of the two stable states of the differential comparator 100.

Alternatively, when $I_{IN}<0$, the node 110a will "clip" to the supply voltage $V_{SS}$ and the node 110b will "clip" to the supply voltage $V_{DD}$. A logic "0" and a logic "1" are therefore output at the nodes 110a and 110b, respectively, at the end of the latch phase. This output state is a second stable state of the differential comparator 100.

In practice, the threshold level of the differential comparator 100 will deviate from $I_{IN}=0$. The actual threshold level of the differential comparator will deviate from $I_{IN}=0$ due to a physical mismatch between the NMOSFET 106a and the NMOSFET 106b. The differential comparator 100 becomes susceptible to inaccuracy as the deviation from the ideal threshold level increases, and as the input current level decreases. That is, a deviation from an ideal threshold level may cause the differential comparator 100 to provide the wrong output for a given input. Because the differential comparator 100 does not have offset compensation, the differential comparator 100 must rely on preamplification of the input signal to overcome any deviation from the ideal threshold level.

Figure 3:
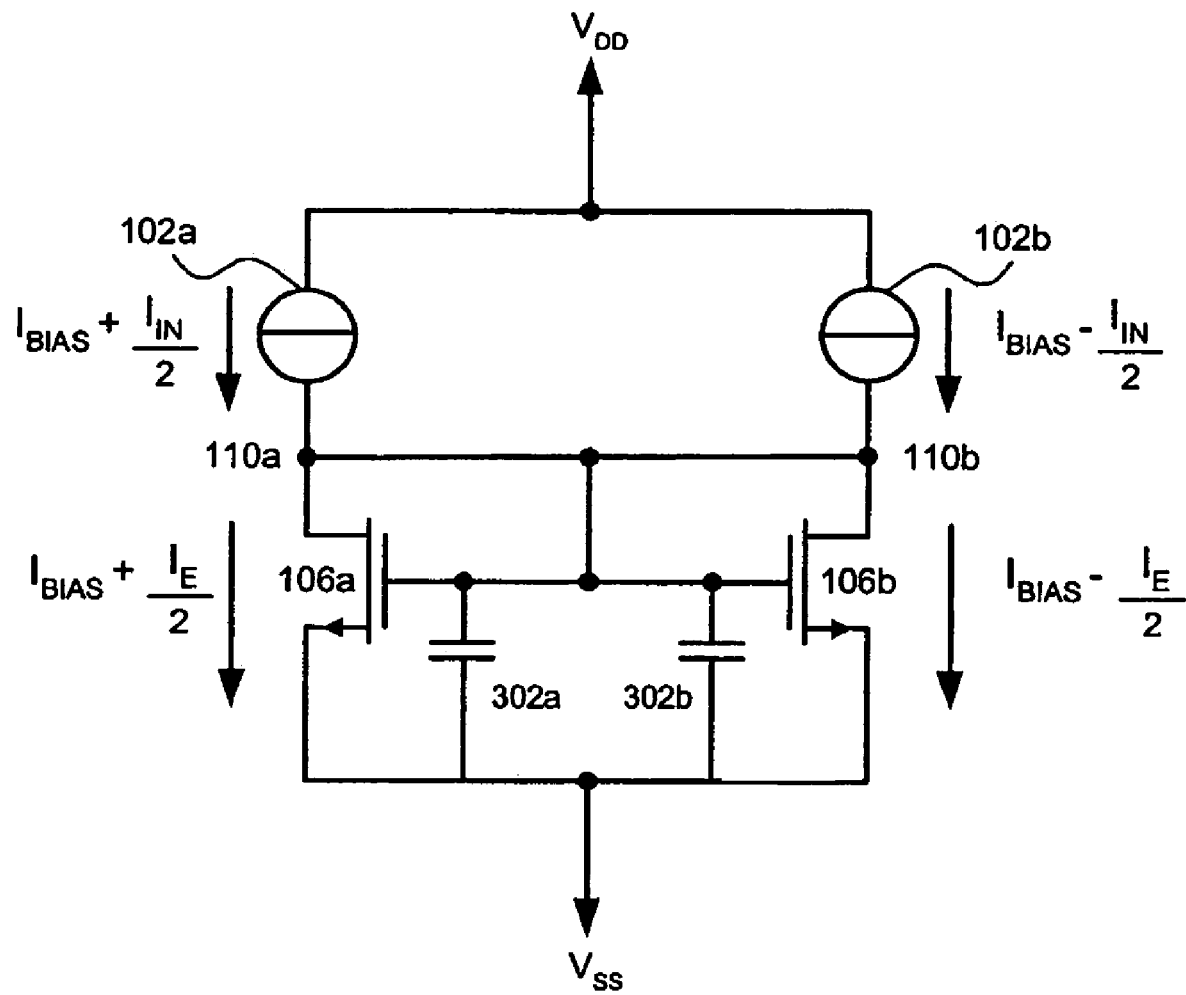
FIG. 3 illustrates a behavior of a portion of the exemplary conventional differential comparator in the presence of mismatch during a reset phase.

FIG. 3 illustrates a behavior of the NMOSFET 106a and the NMOSFET 106b in the presence of mismatch during the reset phase. As shown in FIG. 3, the node 110a and the node 110b are connected together. The node 110a and the node 110b are also connected to the gate of the NMOSFET 106a and to the gate of the NMOSFET 106b. The NMOSFET 106a and the NMOSFET 106b are each biased as diodes during the reset phase.

FIG. 3 also shows a parasitic capacitance 302a and a parasitic capacitance 302b. The parasitic capacitance 302a is mostly comprised of a gate-source capacitance of the NMOSFET 106a. The parasitic capacitance 302a is therefore shown to be connected between the gate of the NMOSFET 106a and the source of the NMOSFET 106a. Similarly, the parasitic capacitance 302b is mostly comprised of a gate-source capacitance of the NMOSFET 106b. The parasitic capacitance 302b is therefore shown connected between the gate of the NMOSFET 106b and the source of the NMOSFET 106b.

Because the gate of the NMOSFET 106a is connected to the gate of the NMOSFET 106b, a gate-source voltage of the NMOSFET 106a is equal to a gate-source voltage of the NMOSFET 106b. The gate-source voltage of the NMOSFET 106a is stored on the parasitic capacitance 302a. The gate-source voltage of the NMOSFET 106b is stored on the parasitic capacitance 302b. Because the gate-source voltages of the NMOSFET 106a and the NMOSFET 106b are equal, a drain current of the NMOSFET 106a will differ from a drain current of the NMOSFET 106b during the reset phase. Essentially, the mismatch between the NMOSFET 106a and the NMOSFET 106b influences the drain currents of the NMOSFET 106a and the NMOSFET 106b. Specifically, the drain currents of the NMOSFET 106a and the NMOSFET 106b will differ by an error current, $I_E/2$, due to the mismatch. The effect of the mismatch appears as an error current since the gate-source voltages of the NMOSFET 106a and the NMOSFET 106b are forced to be equal during the reset phase. Therefore, the drain current of the NMOSFET 106a is equal to $I_{BIAS}+I_E/2$ while the drain current of the NMOSFET 106b is equal to $I_{BIAS}-I_E/2$.

Figure 4:
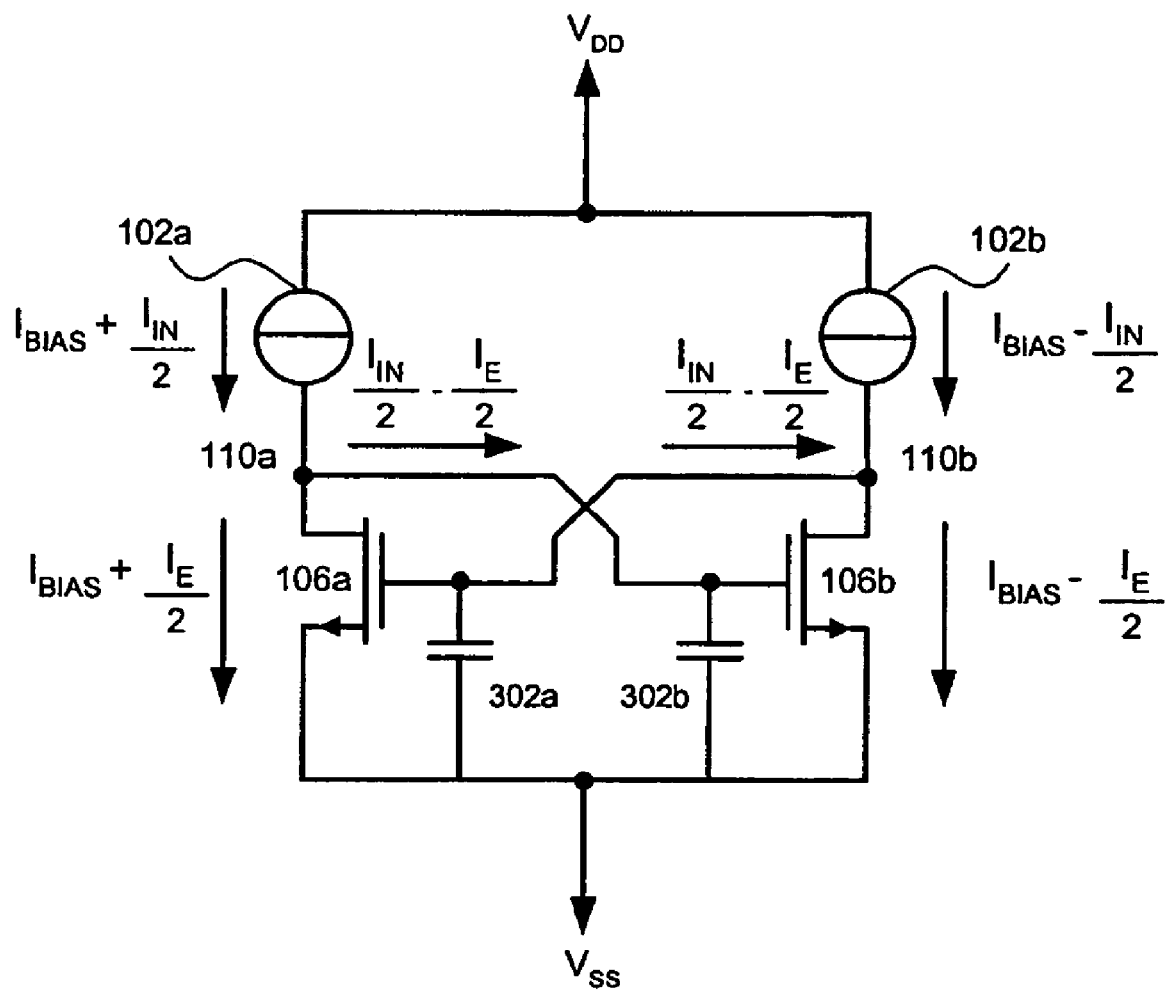
FIG. 4 illustrates a behavior of a portion of the exemplary conventional differential comparator in the presence of mismatch during a latch phase.

FIG. 4 illustrates a behavior of the NMOSFET 106a and the NMOSFET 106b in the presence of mismatch during the latch phase. At the start of the latch phase, the NMOSFET 112 (not shown in FIG. 4) is switched off. The gate of the NMOSFET 106a is therefore disconnected from the gate of the NMOSFET 106b. As shown in FIG. 4, the node 110a is connected to the gate of the NMOSFET 106b. Likewise, the node 110b is connected to the gate of the NMOSFET 106a.

The gate-source voltage stored on the parasitic capacitance 302a causes the drain current of the NMOSFET 106a at the beginning of the latch phase to equal the drain current of the NMOSFET 106a during the reset phase. Specifically, the drain current of the NMOSFET 106a is equal to $I_{BIAS}+I_E/2$ at the start of the latch phase. Similarly, the gate-source voltage stored on the parasitic capacitance 302b causes the drain current of the NMOSFET 106b at the beginning of the latch phase to equal the drain current of the NMOSFET 106b during the reset phase. Specifically, the drain current of the NMOSFET 106b is equal to $I_{BIAS}-I_E/2$ at the start of the latch phase.

Because the drain currents of the NMOSFET 106a and the NMOSFET 106b do not change instantaneously when the differential comparator 100 enters the latch phase, an input current equal to $I_{IN}/2-I_E/2$ will flow from the node 110a into the parasitic capacitance 302b. Also, an input current equal to $I_{IN}/2-I_E/2$ will flow from the parasitic capacitance 302a to the node 110b. Comparing the current flow out of the node 110a and into the node 110b reveals that the threshold level of the differential comparator 100 is equal to $I_E$, instead of the ideal value of zero.

Typically, the bias current $I_{BIAS}$ of the differential comparator 100 is designed to be between approximately 10 μA and 100 μA. Due to the mismatch, the error current $I_E$ is typically about ten percent of the bias current. Therefore, the error current $I_E$ can be between approximately 1 μA and 10 μA. Error currents of this magnitude can have a substantial effect on the accuracy of the differential comparator 100 when the differential-mode signal current is small.

Figure 5:
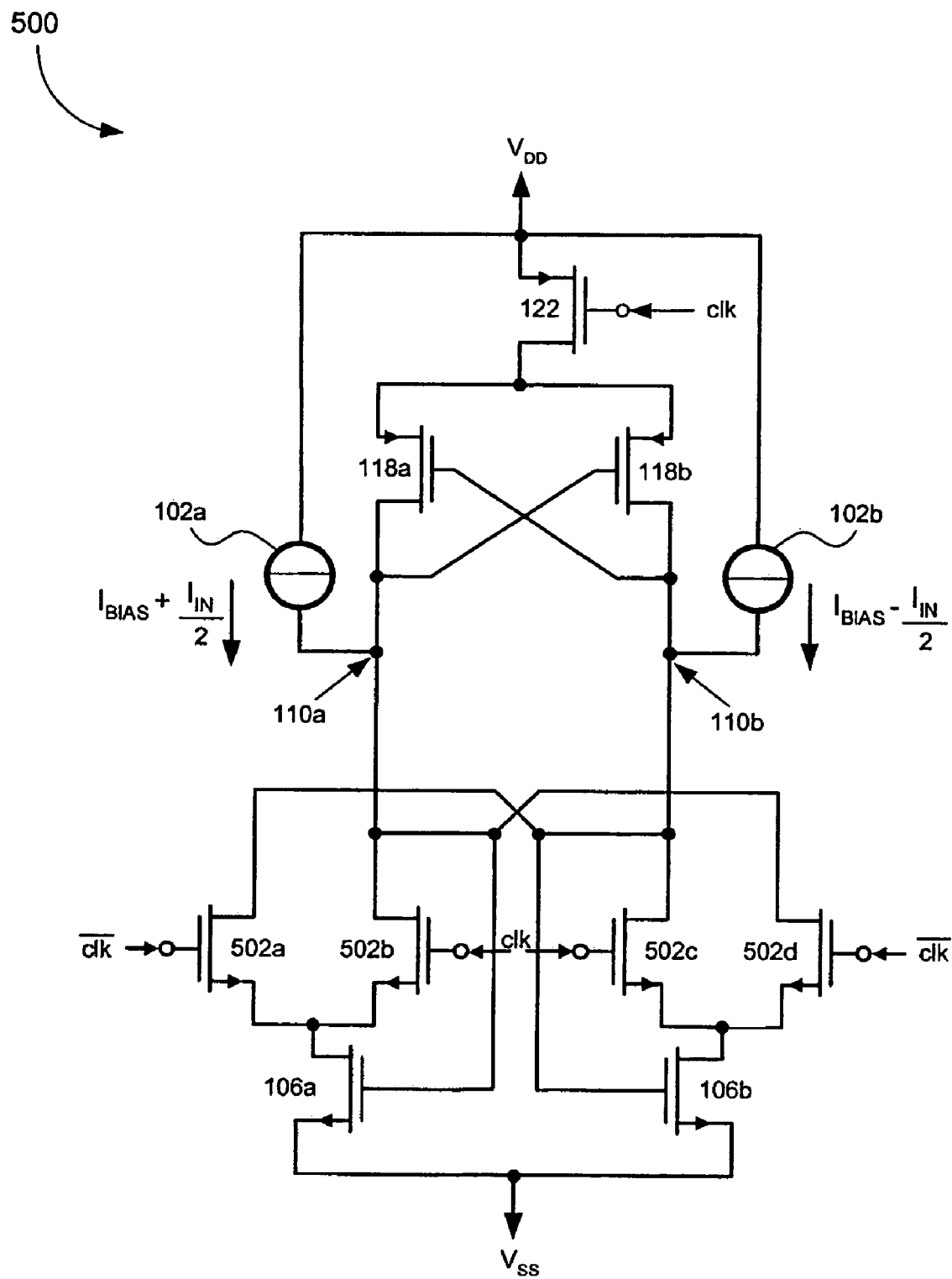
FIG. 5 illustrates a differential comparator of the invention providing offset compensation.

FIG. 5 illustrates a differential comparator 500 that provides offset compensation. The differential comparator 500 uses the gate-source capacitances of the NMOSFET 106a and the NMOSFET 106b to provide the offset compensation. The design of the differential comparator 500 has the advantage of low complexity. Specifically, the differential comparator 500 introduces only a few additional circuit elements compared to the differential comparator 100, to provide offset compensation. The differential comparator 500 also has a doubled input current. That is, the input current provided to the NMOSFET 106a and the NMOSFET 106b during the latch phase is twice as large as the input current provided to the NMOSFET 106a and the NMOSFET 106b in the differential comparator 100.

The differential comparator 500 uses four NMOSFETs as switches to facilitate offset compensation. The four switches are NMOSFET 502a, NMOSFET 502b, NMOSFET 502c and NMOSFET 502d.

As shown in FIG. 5, a source of the NMOSFET 502a is connected to the drain of the NMOSFET 106a. A drain of the NMOSFET 502a is connected to the node 110b and to the gate of the NMOSFET 106b. A gate of the NMOSFET 502a is configured to receive an inverted clock signal ($\overline{clk}$). The NMOSFET 502a is turned on when the inverted clock signal $\overline{clk}$ is relatively high and is turned off when the inverted clock signal $\overline{clk}$ is relatively low. The inverted clock signal $\overline{clk}$ can represent an inverted version of the clock signal clk applied to the gate of the PMOSFET 122 that does not overlap with the clock signal clk.

The NMOSFET 502d is configured similarly to the NMOSFET 502a. A source of the NMOSFET 502d is connected to the drain of the NMOSFET 106b. A drain of the NMOSFET 502d is connected to the node 110a and to the gate of the NMOSFET 106a. A gate of the NMOSFET 502d is also configured to receive the inverted clock signal $\overline{clk}$. The NMOSFET 502d is also turned on when the inverted clock signal $\overline{clk}$ is relatively high and is turned off when the inverted clock signal $\overline{clk}$ is relatively low.

As shown in FIG. 5, the configuration of the NMOSFET 502b and the NMOSFET 502c parallel one another. Specifically, a source of the NMOSFET 502b is connected to the drain of the NMOSFET 106a. A drain of the NMOSFET 502b is connected to the node 110a. A gate of the NMOSFET 502b is configured to receive the clock signal clk. The NMOSFET 502b is turned on when the clock signal clk is relatively high and is turned off when the clock signal clk is relatively low. Similarly, a source of the NMOSFET 502c is connected to the drain of the NMOSFET 106b. A drain of the NMOSFET 502c is connected to the node 110b. A gate of the NMOSFET 502c is configured to receive the clock signal clk. The NMOSFET 502b is also turned on when the clock signal clk is relatively high and is turned off when the clock signal clk is relatively low.

During the reset phase, the inverted clock signal $\overline{clk}$ is relatively low and the clock signal clk is relatively high, causing the NMOSFET 502b and the NMOSFET 502c to turn on. As a result, the drain and the gate of the NMOSFET 106a are connected to the node 110a. Likewise, the drain and the gate of the NMOSFET 106b are connected to the node 110b.

During the latch phase, the clock signal clk is relatively low, and the inverted clock signal $\overline{clk}$ is relatively high. Consequently, the NMOSFET 502b and the NMOSFET 502c are turned off, while the NMOSFET 502a and the NMOSFET 502d are turned on. As a result, the drain of the NMOSFET 106a is connected to the gate of the NMOSFET 106b and to the node 110b. Likewise, the drain of the NMOSFET 106b is connected to the gate of the NMOSFET 106a and to the node 110a.

The gate of the NMOSFET 106a remains connected to the node 110a during both the reset and latch phases. The gate of the NMOSFET 106b remains connected to the node 110b during the reset and latch phases as well. The gates of the NMOSFET 106a and the NMOSFET 106b can provide the output of the differential comparator 500 at the end of the latch phase.

Figure 6:
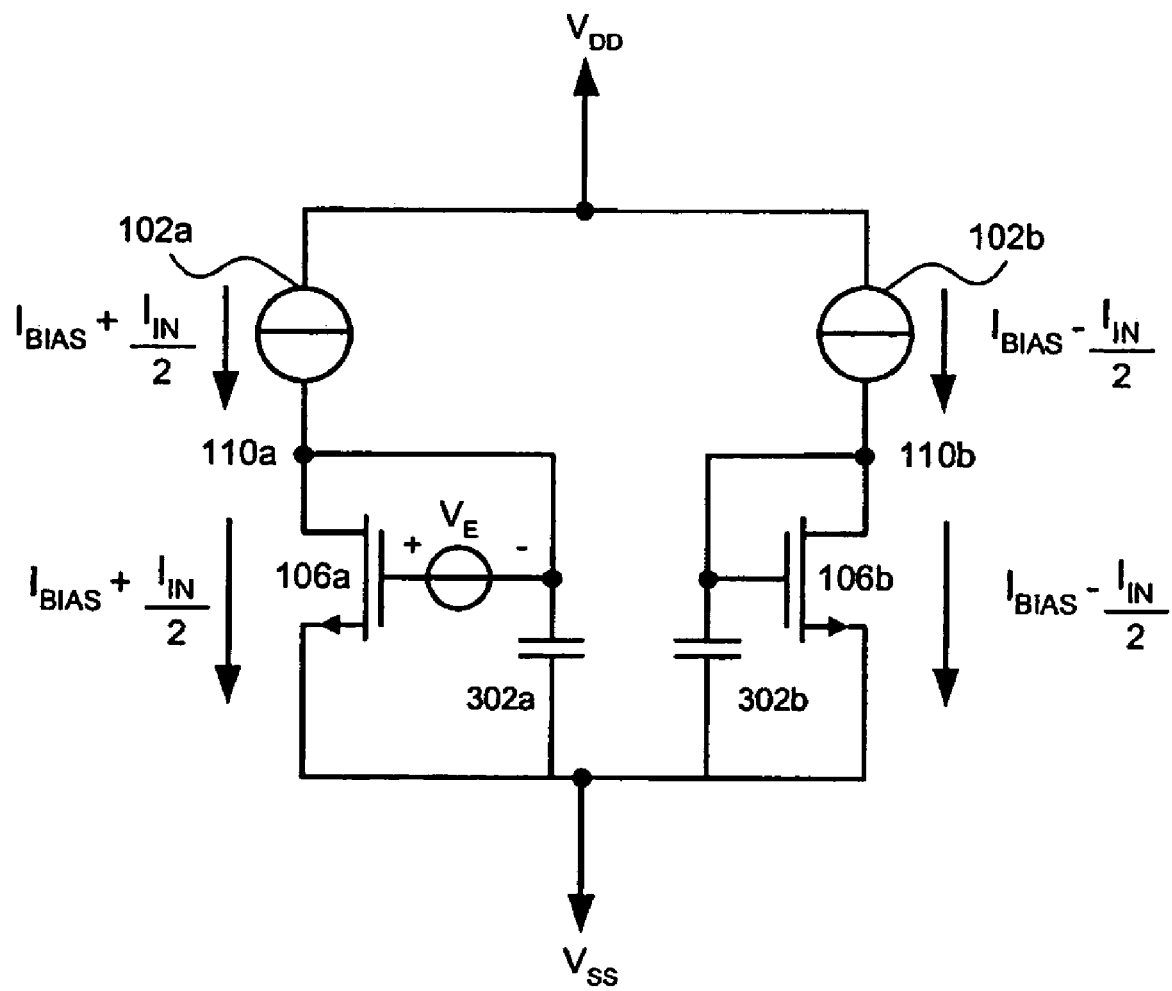
FIG. 6 illustrates a behavior of a portion of the differential comparator of the invention during a reset phase.
Figure 7:
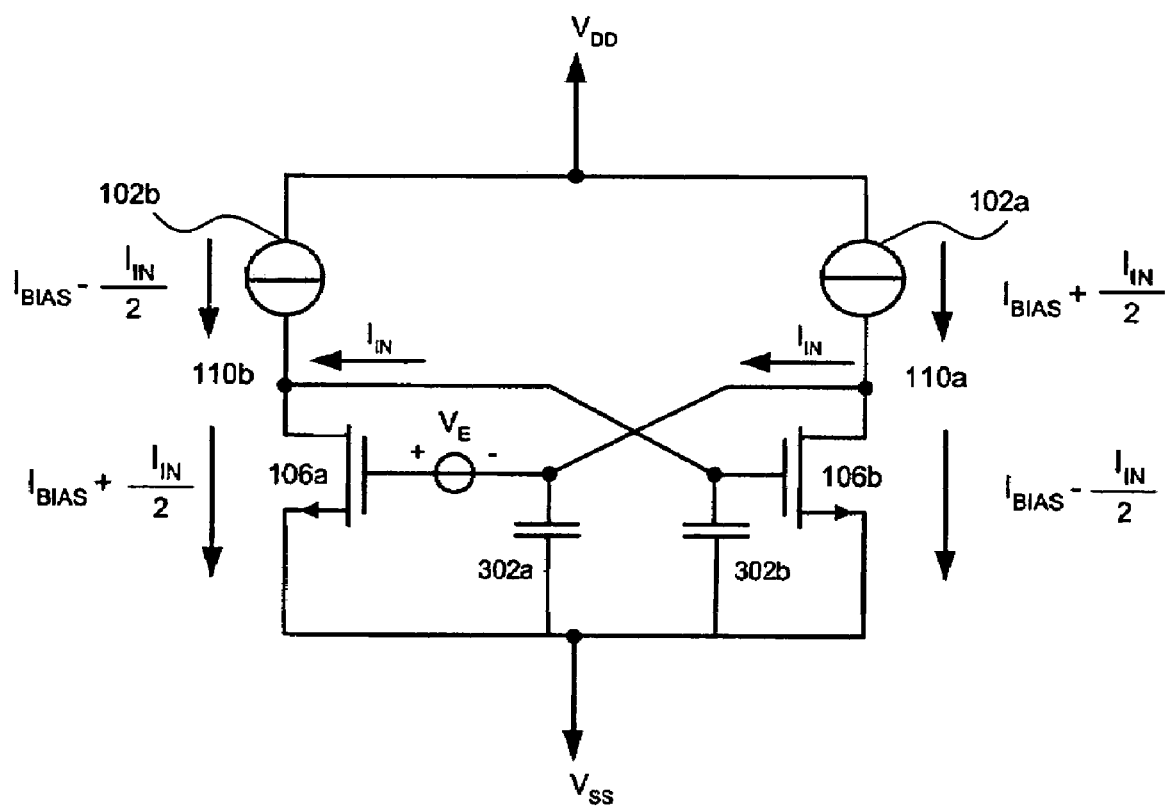
FIG. 7 illustrates a behavior of a portion of the differential comparator of the invention during a latch phase.

The auto-zeroing mechanism of the differential comparator 500 can be understood by examining the operation of the differential comparator 500 during the reset and latch phases. FIGS. 6 and 7 illustrate behaviors of the NMOSFET 106a, the NMOSFET 106b, and the NMOSFETs 506a–d during the reset and latch phases, respectively.

As shown in FIG. 6, the NMOSFET 106a and the NMOSFET 106b are each arranged in a diode configuration. Specifically, the NMOSFETs 106a and 106b are separately biased as diodes since the gates of the NMOSFET 106a and the NMOSFET 106b are not connected together. Because the gates of the NMOSFET 106a and the NMOSFET 106b are not connected together during the reset phase, the gate-source voltages of the NMOSFET 106a and the NMOSFET 106b can differ. The effect of the mismatch between the NMOSFET 106a and the NMOSFET 106b therefore appears as a difference in the gate-source voltages of the NMOSFET 106a and the NMOSFET 106b. Specifically, the mismatch between the NMOSFET 106a and the NMOSFET 106b appears as a transistor threshold voltage mismatch $V_E$.

Because the mismatch between the NMOSFET 106a and the NMOSFET 106b appears as a threshold voltage mismatch $V_E$, the mismatch will not influence the drain currents of the NMOSFET 106a and the NMOSFET 106b. Therefore, the drain current of the NMOSFET 106a will be equal to the input current from the current source 102a. Specifically, the drain current of the NMOSFET 106a during the reset phase is equal to $I_{BIAS}+I_{IN}/2$. Similarly, the drain current of the NMOSFET 106b will be equal to the input current of the current source 102b. Specifically, the drain current of the NMOSFET 106b during the reset phase is equal to $I_{BIAS}-I_{IN}/2$. This result is desirable since the input to the differential comparator 500 is a current. Furthermore, the gate-source voltages of the NMOSFET 106a and the NMOSFET 106b are stored on parasitic capacitances 302a and 302b, respectively. This enables the differential comparator 500 to store the comparator offset voltage on parasitic capacitances 302a and 302b.

FIG. 7 illustrate a behavior of the NMOSFET 106a, the NMOSFET 106b, and the NMOSFETs 506a–d during the latch phases. During the latch phase, the drain of the NMOSFET 106a is connected to the gate of the NMOSFET 106b. Likewise, the drain of the NMOSFET 106b is connected to the gate of the NMOSFET 106a. This arrangement is used to configure the NMOSFET 106a and the NMOSFET 106b as the NMOS latch.

The voltages on the parasitic capacitances 302a and 302b cannot change instantaneously when the differential comparator 500 switches from the reset phase to the latch phase. Therefore, at the start of the latch phase, the voltage stored on the parasitic capacitance 302a is equal to the voltage stored on the parasitic capacitance 302a during the reset phase. This causes the drain current of the NMOSFET 106a to equal the drain current of the NMOSFET 106a during the reset phase. Specifically, the drain current of the NMOSFET 106a is equal to $I_{BIAS}+I_{IN}/2$ at the start of the latch phase. Furthermore, the voltage stored on the parasitic capacitance 302b at the start of the latch phase is equal to the voltage stored on the parasitic capacitance 302b during the reset phase. This also causes the drain current of the NMOSFET 106b to equal the drain current of the NMOSFET 106b during the reset phase. Specifically, the drain current of the NMOSFET 106b is equal to $I_{BIAS}-I_{IN}/2$ at the start of the latch phase.

Because the drain currents of the NMOSFET 106a and the NMOSFET 106b match the input currents applied to the node 110a and the node 110b, respectively, a current equal to $I_{IN}$ flows into the parasitic capacitance 302a from the node 110a. Similarly, a current equal to $I_{IN}$ flows out of the parasitic capacitance 302b and into the node 110b. The currents supplied to the NMOSFET 106a and the NMOSFET 106b do not contain an error signal component. Therefore, the threshold level of the comparator 500 is zero.

The input currents applied to the drains of the NMOSFET 106a and the NMOSFET 106b are swapped when the differential comparator 500 transitions from the reset phase to the latch phase. Specifically, during the reset phase, input currents equal to $I_{BIAS}+I_{IN}/2$ and $I_{BIAS}-I_{IN}/2$ are connected to the drains of the NMOSFET 106a and the NMOSFET 106b, respectively. During the latch phase, however, input currents equal to $I_{BIAS}-I_{IN}/2$ and $I_{BIAS}+I_{IN}/2$ are connected to the drains of the NMOSFET 106a and the NMOSFET 106b, respectively.

Switching the input currents applied to the drains of the NMOSFET 106a and the NMOSFET 106b approximately doubles the currents that flow into the parasitic capacitance 302a and out of the parasitic capacitance 302b. Providing an approximately doubled current helps to further reduce the effect of the offset of the differential comparator 500. The double sampling effect illustrated in FIG. 7 is apparent when comparing the input current supplied to the NMOSFET 106a and the NMOSFET 106b by the differential comparator 100 in FIG. 4. In FIG. 4, input currents provided to the NMOSFET 106a and the NMOSFET 106b are only equal to $-I_{IN}/2$ and $I_{IN}/2$, respectively.

The offset of the differential comparator 500 is significantly reduced in comparison to the offset of the differential comparator 100. Specifically, in practice, the offset of the differential comparator is reduced by approximately a factor of ten when compared to the differential comparator 100.

Figure 8:
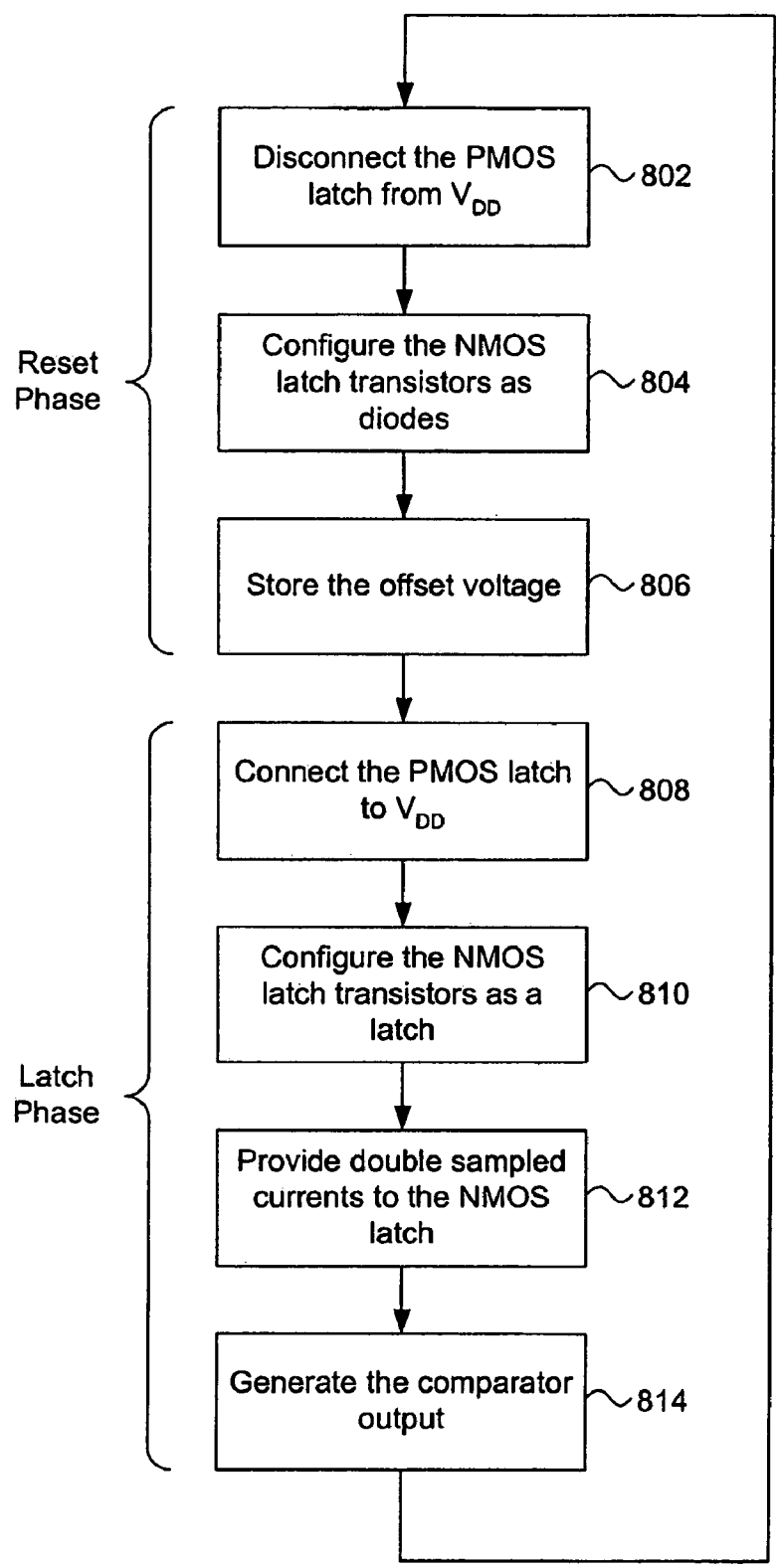
FIG. 8 shows a flowchart of a method by which the differential comparator of the invention provides offset compensation.

FIG. 8 shows a flowchart of a method by which the differential comparator 500 provides offset compensation in order to provide a reliable comparator output. At step 802, the PMOS latch is disconnected from the supply voltage $V_{DD}$. The PMOS latch is disconnected from the supply voltage $V_{DD}$ when the clock signal clk is relatively high. The PMOSFET 122 is turned off when the clock signal clk is relatively high. Consequently, the sources of the PMOSFET 118a and the PMOSFET 118b are disconnected from the supply voltage $V_{DD}$.

At step 804, the NMOSFET 106a and the NMOSFET 106b are separately configured as diodes. The NMOSFET 106a and the NMOSFET 106b are configured as diodes when the NMOSFET 502b and the NMOSFET 502c are turned on. The NMOSFET 502b and the NMOSFET 502c are turned on when the clock signal clk is relatively high. At step 804, the drain current of the NMOSFET 106a matches the input current supplied by the current source 102a. Further, the drain current of the NMOSFET 106b matches the input current supplied by the current source 102b.

At step 806, the offset voltage of the differential comparator 500 is stored. The gate-source voltages of the NMOSFET 106a and the NMOSFET 106b comprise the offset voltage. The offset voltage is stored on the parasitic capacitance 302a and the parasitic capacitance 302b.

Steps 802 through 806 occur during the reset phase of the differential comparator. The differential comparator is in the reset phase when the clock signal clk is relatively high and the inverted clock signal $\overline{clk}$ is relatively low.

At step 808, the PMOS latch is connected to the supply voltage $V_{DD}$. The PMOS latch is connected to the supply voltage $V_{DD}$ when the clock signal clk is relatively low. The PMOSFET 122 is turned on when the clock signal clk is relatively low. Consequently, the sources of the PMOSFET 118a and the PMOSFET 118b are connected to the supply voltage $V_{DD}$.

At step 810, the NMOSFET 106a and the NMOSFET 106b are configured as an NMOS latch. The NMOSFET 106a and the NMOSFET 106b are configured as an NMOS latch when the NMOSFET 502a and the NMOSFET 502d are turned on and the NMOSFET 502b and the NMOSFET 502c are turned off. The NMOSFET 502a and the NMOSFET 502d are turned on when the inverted clock signal $\overline{clk}$ is relatively high. The NMOSFET 502b and the NMOSFET 502c are turned off when the clock signal clk is relatively low.

At step 810, the drain of the NMOSFET 106a is connected to the gate of the NMOSFET 106b. The drain of the NMOSFET 106b is also connected to the gate of the NMOSFET 106a. Effectively, the input nodes 110a and 110b are switched between the drains of the NMOSFET 106a and the NMOSFET 106b.

At step 812, double sampled currents are provided to the NMOS latch. Swapping the connections of the drains of the NMOSFET 106a and the NMOSFET 106b causes a current equal to $I_{IN}$ to flow into the parasitic capacitance 302a from the node 110a. A current equal to $I_{IN}$ flows from the parasitic capacitance 302b to the node 110b. This causes the offset of the differential comparator 500 to be zero. The currents provided to the NMOS latch are approximately twice as large as the differential-mode signal current components provided by the current source 102a and the current source 102b.

At step 814, the differential comparator 500 provides the comparator output at the node 110a and the node 110b. The comparator output is more reliable due to the offset compensation method employed by the differential comparator 500. Steps 808 through 814 occur during the latch phase of the differential comparator. The differential comparator is in the latch phase when the clock signal clk is relatively low and the inverted clock signal $\overline{clk}$ is relatively high. Steps 802 through 814 are repeated in sequence for each clock cycle of the differential comparator 500. Therefore, at the end of step 814 (i.e., the end of the latch phase), the comparator 500 starts again at step 802 (i.e., the start of the reset phase).

CONCLUSION

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A differential comparator comprising:
   a first transistor receiving a first input current at a first node; and
   a second transistor receiving a second input current at a second node,
   wherein the first and the second transistors are biased as diodes during a reset phase to store an offset voltage on parasitic capacitances of the first and the second transistors, and are connected together as a latch to provide an output during a latch phase;

wherein a gate-source voltage of the first transistor is stored on a parasitic capacitance of the first transistor during the reset phase; wherein a gate-source voltage of the second transistor is stored on a parasitic capacitance of the second transistor during the reset phase;

wherein the gate-source voltage of the first transistor and the gate-source voltage of the second transistor comprise the offset voltage.

2. The differential comparator of claim 1, wherein a gate of the first transistor is connected to the first input current at the first node and a gate of the second transistor is connected to the second input current at the second node.

3. The differential comparator of claim 1, wherein a source of the first transistor and a source of the second transistor are connected to a low voltage.

4. The differential comparator of claim 1, further comprising:

a first switch that connects a drain of the first transistor to the first input current during the reset phase;

a second switch that connects a drain of the second transistor to the second input current during the reset phase;

a third switch that connects the drain of the first transistor to a gate of the second transistor and to the second input current during the latch phase; and a fourth switch that connects the drain of the second transistor to a gate of the first transistor and to the first input current during the latch phase.

5. The differential comparator of claim 4, wherein the first, second, third and fourth switches are N-channel type metal oxide semiconductor field effect transistors (NMOSFETs).

6. The differential comparator of claim 1, further comprising third and fourth transistors, wherein:

a gate of the third transistor is connected to a drain of the fourth transistor;

a gate of the fourth transistor is connected to a drain of the third transistor; and the drains of the third and the fourth transistors are connected to the first node and the second node, respectively.

7. The differential comparator of claim 6, wherein the first and the second transistors are NMOSFETs and the third and the fourth transistors are P-channel type metal oxide semiconductor field effect transistors (PMOSFETs).

8. The differential comparator of claim 6, further comprising a switch, wherein the switch connects a source of the third transistor and a source of the fourth transistor to a high voltage during the latch phase.

9. The differential comparator of claim 8, wherein the switch is a PMOSFET.

10. The differential comparator of claim 1, wherein a drain current of the first transistor is substantially equal to the first input current and a drain current of the second transistor is substantially equal to the second input current, during the reset phase.

11. The differential comparator of claim 10, wherein the drain current of the first transistor is substantially equal to the first input current and the drain current of the second transistor is substantially equal to the second input current, at the beginning of the latch phase.

12. The differential comparator of claim 1, wherein, during the latch phase:

a first current flows from the first node into the parasitic capacitance of the first transistor; and a second current flows from the second node to the parasitic capacitance of the second transistor.

13. The differential comparator of claim 12, wherein:

the first current is approximately twice as large as a differential-mode signal current provided by the first input current; and the second current is approximately twice as large as a differential-mode signal current provided by the second input current.

14. The differential comparator of claim 1, wherein a gate of the first transistor and a gate of the second transistor are connected to the output.

15. A differential comparator comprising:

a first transistor receiving a first input current at a first node; and a second transistor receiving a second input current at a second node, wherein the first and the second transistors are biased as diodes during a reset phase to store an offset voltage on parasitic capacitances of the first and the second transistors, and are connected together as a latch to provide an output during a latch phase;

wherein a drain current of the first transistor is substantially equal to the first input current and a drain current of the second transistor is substantially equal to the second input current, during the reset phase.

16. The differential comparator of claim 15, wherein, during the latch phase:

a first current flows from the first node into the parasitic capacitance of the first transistor; and a second current flows from the second node to the parasitic capacitance of the second transistor.

17. The differential comparator of claim 16, wherein:

the first current is approximately twice as large as a differential-mode signal current provided by the first input current; and the second current is approximately twice as large as a differential-mode signal current provided by the second input current.

* * * * *